United States Patent
Cao et al.

(10) Patent No.: US 10,871,685 B2
(45) Date of Patent: Dec. 22, 2020

(54) ARRAY SUBSTRATE AND MANUFACTURING METHOD THEREOF, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Binbin Cao, Beijing (CN); Li Ai, Beijing (CN); Hui Zhang, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/335,995

(22) PCT Filed: May 23, 2018

(86) PCT No.: PCT/CN2018/088012
§ 371 (c)(1),
(2) Date: Mar. 22, 2019

(87) PCT Pub. No.: WO2019/041898
PCT Pub. Date: Mar. 7, 2019

(65) Prior Publication Data
US 2019/0265536 A1 Aug. 29, 2019

(30) Foreign Application Priority Data
Aug. 31, 2017 (CN) .......................... 2017 1 0774031

(51) Int. Cl.
*H01L 27/12* (2006.01)
*G02F 1/1343* (2006.01)
(Continued)

(52) U.S. Cl.
CPC ........ *G02F 1/13439* (2013.01); *G02F 1/1368* (2013.01); *G02F 1/133345* (2013.01);
(Continued)

(58) Field of Classification Search
CPC ............. H01L 27/1214; H01L 27/1218; H01L 27/1251; H01L 27/1259; H01L 27/1262;
(Continued)

(56) References Cited

U.S. PATENT DOCUMENTS 6,184,960 B1 * 2/2001 Sawayama ........ G02F 1/133553
349/139
2009/0251646 A1 * 10/2009 Yoo ..................... G02F 1/13439
349/106
(Continued)

FOREIGN PATENT DOCUMENTS

CN 101393346 A 3/2009
CN 101556414 A 10/2009
(Continued)

OTHER PUBLICATIONS

Aug. 30, 2018—(WO) International Search Report and the Written Opinion Appn PCT/CN2018/088012 with English Translation.
(Continued)

*Primary Examiner* — Stephen W Smoot
(74) *Attorney, Agent, or Firm* — Banner & Witcoff, Ltd.

(57) ABSTRACT

An array substrate, a manufacturing method thereof and a display device are provided. The array substrate includes: a base substrate, a reflection region layered structure and a reflection electrode. The base substrate includes a pixel region, the pixel region includes a reflection region. The reflection region layered structure is in the reflection region, and includes a particle layer, the particle layer is configured to provide a granular rough surface on a side of the reflection (Continued)

region layered structure facing away from the base substrate. The reflection electrode is on the particle layer.

15 Claims, 11 Drawing Sheets

(51) Int. Cl.
- *G02F 1/1333* (2006.01)
- *G02F 1/1335* (2006.01)
- *G02F 1/1368* (2006.01)
- *H01L 31/0236* (2006.01)
- *H01L 31/0232* (2014.01)
- *G02F 1/1362* (2006.01)

(52) U.S. Cl.
CPC ........ G02F 1/133553 (2013.01); H01L 27/12 (2013.01); H01L 27/1214 (2013.01); H01L 27/1262 (2013.01); H01L 31/02327 (2013.01); H01L 31/02366 (2013.01); *G02F 2001/136236* (2013.01); *G02F 2201/123* (2013.01); *G02F 2203/09* (2013.01)

(58) Field of Classification Search
CPC ......... H01L 31/02327; H01L 31/02366; H01L 31/18; H01L 33/005; H01L 33/22; G02F 1/133553; G02F 1/133555; G02F 2203/09
See application file for complete search history.

(56) References Cited

U.S. PATENT DOCUMENTS

| | | | | |
|---|---|---|---|---|
| 2013/0078750 A1* | 3/2013 | Yeo, II | ................ | B81C 1/00031 438/29 |
| 2016/0238893 A1* | 8/2016 | Wang | ................... | H01L 27/1288 |
| 2016/0306241 A1* | 10/2016 | Choi | ................. | G02F 1/133504 |
| 2018/0151548 A1* | 5/2018 | Pfeuffer | ................ | H01L 27/156 |

FOREIGN PATENT DOCUMENTS

| | | |
|---|---|---|
| CN | 103226270 A | 7/2013 |
| CN | 103985717 A | 8/2014 |
| CN | 105097837 A | 11/2015 |
| CN | 205787482 U | 12/2016 |
| JP | 2013015353 A | 1/2013 |
| KR | 20070111029 A | 11/2007 |

OTHER PUBLICATIONS

Mar. 16, 2020—(CN) First Office Action Appn 201710774031.6 with English Translation.

Sep. 17, 2020—CN Second Office Action Appn 201710774031.6 with English Translation.

\* cited by examiner

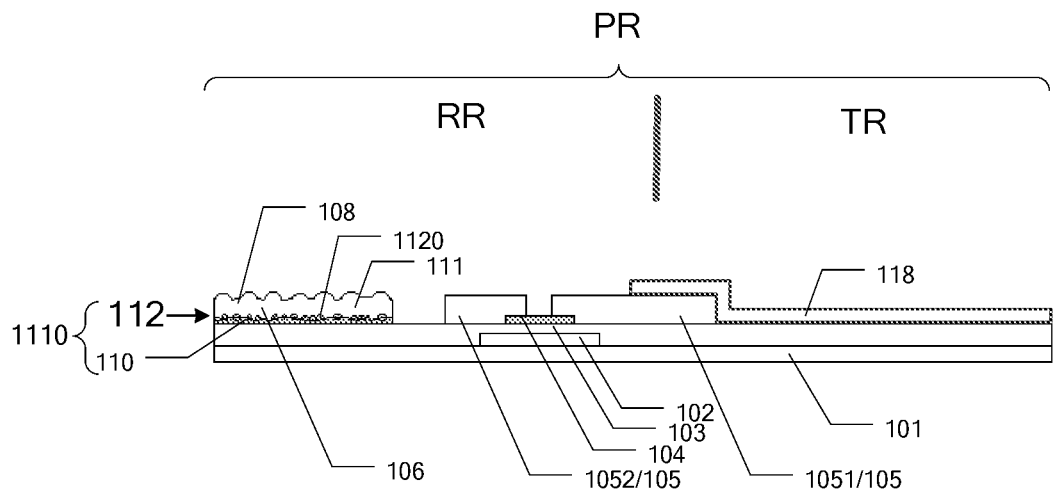

FIG. 6 forming a reflection region film on a base substrate, the base substrate including a pixel region, the pixel region including a reflection region, the reflection region film being formed in the reflection region

↓ roughening a surface of the reflection region film facing away from the base substrate to form a particle layer

↓ forming a reflection electrode on the particle layer

ARRAY SUBSTRATE AND MANUFACTURING METHOD THEREOF, AND DISPLAY DEVICE

CROSS REFERENCE TO RELATED APPLICATIONS

The application is a U.S. National Phase Entry of International Application No. PCT/CN2018/088012 filed on May 23, 2018, designating the United States of America and claiming priority to Chinese Patent Application No. 201710774031.6 filed on Aug. 31, 2017. The present application claims priority to and the benefit of the above-identified applications and the above-identified applications are incorporated by reference herein in their entirety.

TECHNICAL FIELD

At least one embodiment of the present disclosure relates to an array substrate a manufacturing method thereof, and a display device.

BACKGROUND

A light source of a liquid crystal display is mainly a backlight, and the backlight has a greatly decreased utilization ratio because the backlight has to pass through a base substrate, a color filter, etc., which even causes that a display image on a screen cannot be seen clearly at outdoors with a strong light. In order to achieve a better display performance both at indoors and at outdoors with a strong light, a transflective display screen has been developed in the industry.

SUMMARY

At least one embodiment of the present disclosure relates to an array substrate, a manufacturing method thereof and a display device, so as to improve a diffuse reflection effect of a reflection region.

At least one embodiment of the present disclosure provides an array substrate, which includes:

a base substrate including a pixel region, the pixel region including a reflection region;

a reflection region layered structure in the reflection region, the reflection region layered structure including a particle layer, the particle layer being configured to provide a granular rough surface on a side of the reflection region layered structure facing away from the base substrate; and a reflection electrode on the particle layer.

According to the array substrate provided by one or more embodiments of the present disclosure, the reflection region layered structure includes a base portion, and the particle layer is on a side of the base portion facing away from the base substrate and is in contact with the base portion.

According to the array substrate provided by one or more embodiments of the present disclosure, a material of the base portion includes a conductive material or a semiconductor material.

According to the array substrate provided by one or more embodiments of the present disclosure, the material of the base portion includes a metal oxide, and a material of the particle layer includes a metal.

According to the array substrate provided by one or more embodiments of the present disclosure, the metal oxide includes at least one selected from the group consisting of indium tin oxide (ITO) and indium gallium zinc oxide (IGZO).

According to the array substrate provided by one or more embodiments of the present disclosure, a size of a particle in the particle layer is less than or equal to 100 nm.

According to the array substrate provided by one or more embodiments of the present disclosure, the pixel region further includes a transmission region, the transmission region includes a transmission electrode, and the reflection region layered structure and the transmission electrode are in a same layer.

According to the array substrate provided by one or more embodiments of the present disclosure, the array substrate further includes a thin film transistor, the thin film transistor includes a semiconductor active layer and a source-drain electrode layer, the reflection region layered structure and the semiconductor active layer are in a same layer, the reflection electrode and the source-drain electrode layer are in a same layer.

At least one embodiment of the present disclosure further provides a manufacturing method of an array substrate, which includes:

forming a reflection region film on a base substrate, the base substrate including a pixel region, the pixel region including a reflection region, the reflection region film being formed in the reflection region;

roughening a surface of the reflection region film facing away from the base substrate to form a particle layer; and forming a reflection electrode on the particle layer.

According to the manufacturing method provided by one or more embodiments of the present disclosure, a material of the reflection region film includes a conductive material or a semiconductor material.

According to the manufacturing method provided by one or more embodiments of the present disclosure, the material of the reflection region film includes a metal oxide, and a material of the particle layer includes a metal.

According to the manufacturing method provided by one or more embodiments of the present disclosure, the metal oxide includes at least one selected from the group consisting of indium tin oxide (ITO) and indium gallium zinc oxide (IGZO).

According to the manufacturing method provided by one or more embodiments of the present disclosure, roughening the surface of the reflection region film facing away from the base substrate to form the particle layer includes: performing a reduction treatment on the reflection region film to allow at least the metal oxide contained in the surface of the reflection region film to be reduced into metal particles, the particle layer being configured to provide a granular rough surface on a side of the reflection region film facing away from the base substrate.

According to the manufacturing method provided by one or more embodiments of the present disclosure, the reflection region film is subjected to the reduction treatment to allow an entirety of the metal oxide contained in the reflection region film to be reduced into metal particles.

According to the manufacturing method provided by one or more embodiments of the present disclosure, the reduction treatment is performed on the reflection region film with a plasma.

According to the manufacturing method provided by one or more embodiments of the present disclosure, the plasma is a reductive plasma, and the reductive plasma includes at least one selected from the group consisting of a hydrogen plasma and an ammonia plasma.

According to the manufacturing method provided by one or more embodiments of the present disclosure, a size of a particle in the particle layer is less than or equal to 100 nm.

According to the manufacturing method provided by one or more embodiments of the present disclosure, the pixel region further includes a transmission region, the transmission region includes a transmission electrode, and the reflection region film and the transmission electrode are in a same layer.

According to the manufacturing method provided by one or more embodiments of the present disclosure, the manufacturing method further includes forming a thin film transistor, the thin film transistor includes a semiconductor active layer and a source-drain electrode layer, the reflection region film and the semiconductor active layer are in a same layer, the reflection electrode and the source-drain electrode layer are in a same layer.

At least one embodiment of the present disclosure further provides a display device, which includes the array substrate provided by any one of the embodiments of the present disclosure.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

FIG. 6 is a schematic cross-sectional view of an array substrate provided by another embodiment of the present disclosure;

FIG. 7 is a flowchart of a manufacturing method of an array substrate provided by an embodiment of the present disclosure;

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not limited to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
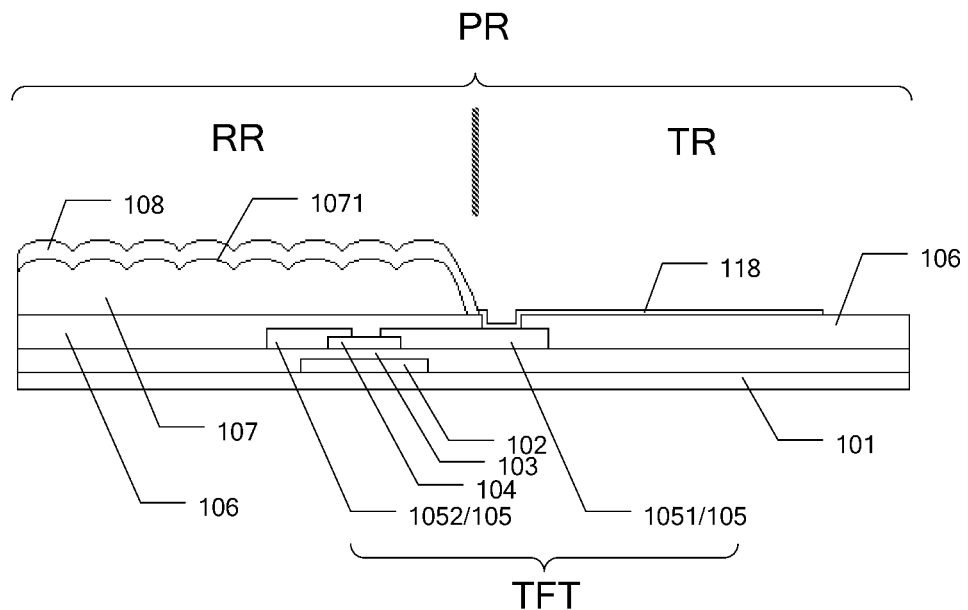
FIG. 1 is a schematic structural view of a transflective array substrate.

FIG. 1 illustrates a schematic structural view of a transflective array substrate. As illustrated in FIG. 1, the array substrate includes a pixel region PR, the pixel region PR includes a reflection region RR and a transmission region TR.

As illustrated in FIG. 1, the array substrate includes a base substrate 101 and a thin film transistor (TFT) disposed thereon. The TFT includes a gate electrode 102, a gate insulation layer 103, a semiconductor active layer 104, and a source-drain electrode layer 105. The source-drain electrode layer 105 includes a drain electrode 1051 and a source electrode 1052. A passivation layer 106 is disposed on the TFT. In the reflection region RR, a resin layer 107 is disposed on the passivation layer 106, the resin layer 107 has an uneven surface 1071 on a side of the resin layer 107 facing away from the base substrate 101, and a reflection electrode 108 is disposed on the resin layer 107. In the transmission region TR, a transmission electrode 118 is disposed on the passivation layer 106. The transmission electrode 118 is electrically connected to the drain electrode 1051 through a through-hole penetrating the passivation layer 106. For example, the transmission electrode 118 can be electrically connected to the reflection electrode 108, without limited thereto. For example, the transmission electrode 118 and the reflection electrode 108 can be insulated from each other and be controlled by different TFTs, respectively.

In order to increase a reflectivity and a viewing angle while avoiding a phenomenon of specular reflection, a surface of the reflection electrode (for example, made of a metal Al) is designed to be in an uneven shape, so that an incident light is diffusely reflected. If a reflection electrode with a smooth specular surface is used as the reflection electrode, an observer's own face is reflected. For example, a resin having an uneven surface can be fabricated by a half tone mask to form a reflection electrode with a surface in a corresponding shape. Due to a limitation of exposure accuracy of negative photoresist, a surface of the resin is not arranged to be continuously uneven at various positions, but has a plurality of specular reflection parts; therefore, the diffuse reflection thereof is poor, which affects the viewing angle and a visual effect of the reflection region. For example, the exposure accuracy of the negative photoresist is at micron scale. For example, the negative photoresist can have an exposure accuracy about 5 μm at most.

Figure 2:
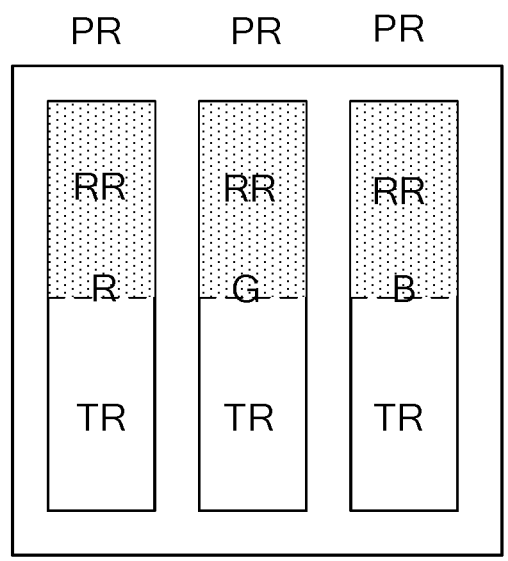
FIG. 2 is a top plan view of a pixel region, a reflection region and a transmission region which are in an array substrate provided by an embodiment of the present disclosure.

FIG. 2 illustrates a top plan view of a pixel region PR, a reflection region RR and a transmission region TR which are in an array substrate. FIG. 2 is illustrated with reference to the case where one of three primary colors consisting of red, green and blue is disposed in a pixel region PR, by way of example. FIG. 2 illustrates three pixel regions PR. Each pixel region PR includes a reflection region RR and a transmission region TR.

Figure 3:
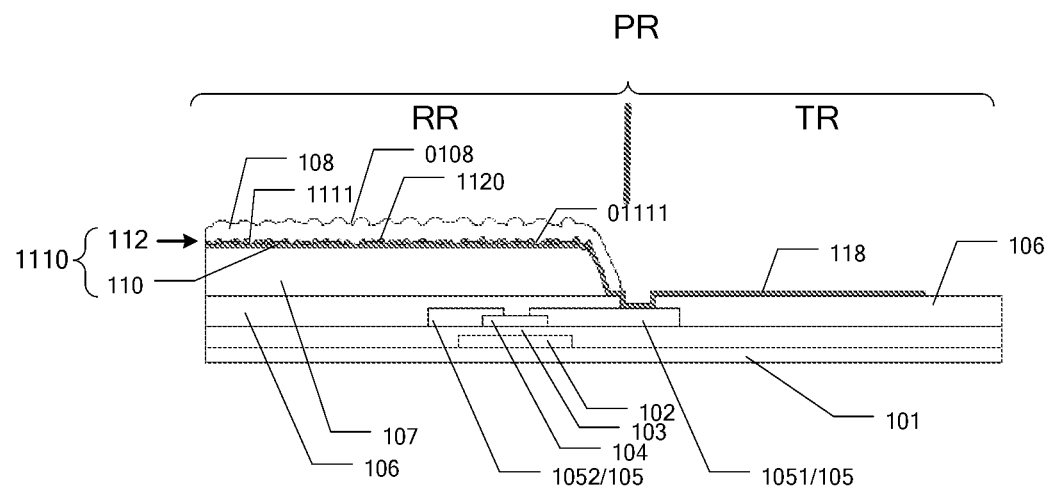
FIG. 3 is a schematic cross-sectional view of an array substrate provided by an embodiment of the present disclosure.

FIG. 3 illustrates a schematic cross-sectional view of an array substrate provided by an embodiment of the present disclosure. As illustrated in FIG. 3, at least one embodiment of the present disclosure provides an array substrate, which includes:

a base substrate 101 including a pixel region PR, the pixel region PR including a reflection region RR;

a reflection region layered structure 1110 in the reflection region RR, the reflection region layered structure 1110 including a particle layer 112, the particle layer 112 being configured to provide a granular rough surface 1111 on a side of the reflection region layered structure 1110 facing away from the base substrate 101; for example, the particle layer 112 being a portion of the reflection region layered structure 1110 facing away from the base substrate 101; and a reflection electrode 108 on the particle layer 112. For example, the reflection electrode 108 is in contact with the particle layer 112.

In the array substrate provided by at least one embodiment of the present disclosure, the particle layer is employed to allow the reflection electrode to have an uneven surface with minute protrusions which are distributed continuously, and the uneven surface with minute protrusions is in a continuous irregular shape, which enables the reflection electrode to have a good diffuse reflection effect, thereby decreasing the specular reflection of the reflection region in a large extent, and increasing the viewing angle and the visual effect of the reflection region.

As illustrated in FIG. 3, according to the array substrate provided by one or more embodiments of the present disclosure, the reflection region layered structure 1110 includes a base portion 110 and a particle layer 112 which are sequentially disposed on the base substrate 101. The particle layer 112 is in contact with the base portion 110 of the reflection region layered structure 1110. For example, the particle layer 112 can be obtained by roughening a surface of a reflection region film 111 (referring to method embodiments, for example, FIG. 8C, similarly hereinafter).

According to the array substrate provided by one or more embodiments of the present disclosure, a material of the base portion 110 includes a conductive material or a semiconductor material. For example, the material of the base portion 110 includes a metal oxide, and a material of the particle layer 112 includes a metal. For example, the metal oxide includes at least one selected from the group consisting of indium tin oxide (ITO) and indium gallium zinc oxide (IGZO), without limited thereto.

For example, the particle layer 112 can be obtained by performing a reduction treatment on the reflection region film 111 made of the metal oxide to allow the metal oxide at least at a surface of the reflection region film 111 to be reduced. For example, the material of the base portion 110 can be the remaining reflection region film that is not reduced into particles. For example, the material of the base portion 110 can be the remaining unreduced metal oxide.

According to the array substrate provided by one or more embodiments of the present disclosure, the particle layer 112 is at nanometer scale, and a size of a particle in the particle layer 112 is less than or equal to 100 nm. The nano-scale particle layer 112 can decrease a distance between adjacent concave portions or a distance between adjacent convex portions of the rough surface (concave-convex surface, bumpy surface) 1111, and improve the precision of the concave-convex surface, thereby increasing the uneven effect of the reflection electrode to improve the diffuse reflection effect of the reflection electrode. FIG. 3 illustrates a recess 0108 of the reflection electrode, and a concave portion 01111 of the rough surface 1111.

For example, the size of the particle in the particle layer 112 ranges from 10 to 100 nm. Metal particles less than 10 nm tend to agglomerate, which is not conducive to form minute particles, and metal particles less than or equal to 100 nm facilitate steps of a process. For example, a size of a metal particle for forming the reflection region film 111 is within the range of the size of the particle in the aforementioned particle layer, so as to facilitate the formation of the particle in the particle layer having the aforementioned particle size. For example, the reflection region film 111 can be formed by a magnetron sputtering method, without limited thereto.

As illustrated in FIG. 3, according to the array substrate provided by one or more embodiments of the present disclosure, the pixel region PR further includes a transmission region TR; therefore, a transflective array substrate can be formed. The transmission region TR includes a transmission electrode 118, and the reflection region layered structure 1110 and the transmission electrode 118 are in the same layer. For example, the reflection region film 111 and the transmission electrode 118 can be formed of the same film by the same patterning process. In the embodiment of the present disclosure, the pixel region PR may also be not provided with the transmission region TR. In one embodiment, a reflective array substrate can be formed.

As illustrated in FIG. 3, according to the array substrate provided by one or more embodiments of the present disclosure, the array substrate further includes a TFT which includes a gate electrode 102, a gate insulation layer 103, a semiconductor active layer 104, and a source-drain electrode layer 105. The source-drain electrode layer 105 includes a drain electrode 1051 and a source electrode 1052. A passivation layer 106 is disposed on the TFT. In the reflection region RR, a resin layer 107 is disposed on the passivation layer 106. For example, an upper surface of the resin layer 107 is a planar surface.

Figure 4A:
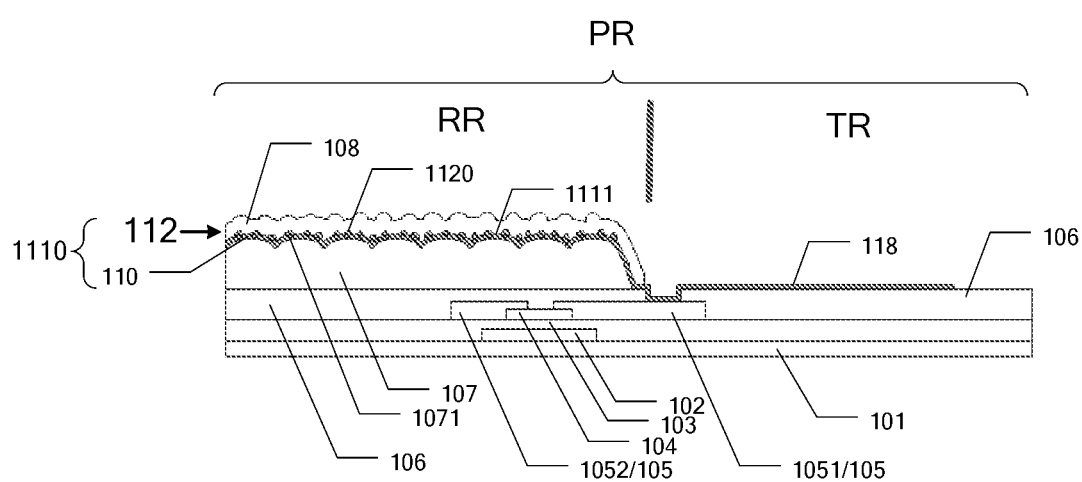
FIG. 4A is a schematic cross-sectional view of an array substrate provided by another embodiment of the present disclosure.

FIG. 4A is a schematic cross-sectional view of an array substrate provided by another embodiment of the present disclosure. As illustrated in FIG. 4A, according to the array substrate provided by one or more embodiments of the present disclosure, an upper surface of the resin layer 107 is an uneven surface 1071. Under a combined effect of the resin layer 107 having the uneven surface 1071 and the particle layer 112, the diffuse reflection effect of the reflection electrode can be further improved.

Figure 4B:
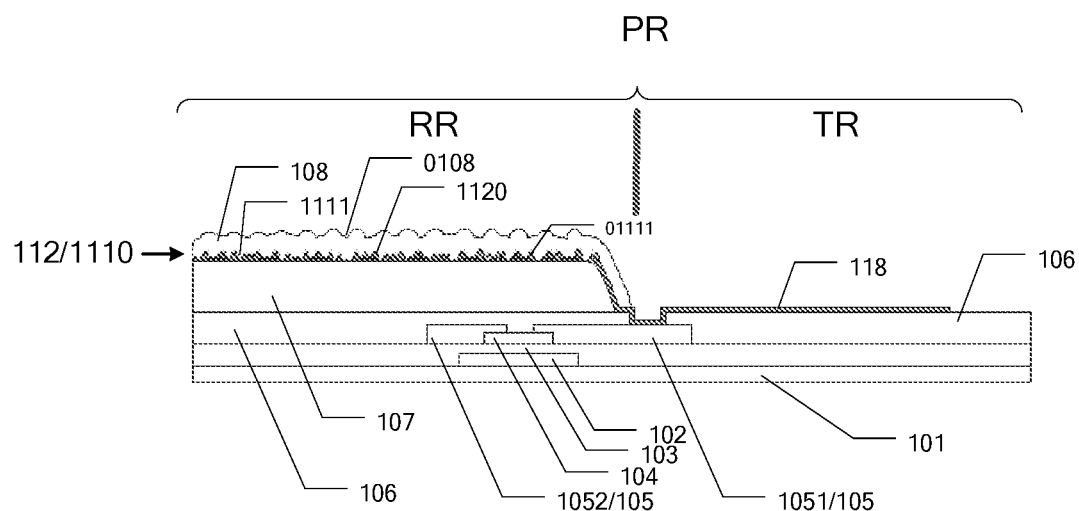
FIG. 4B is a schematic cross-sectional view of an array substrate provided by another embodiment of the present disclosure.

FIG. 4B is a schematic cross-sectional view of an array substrate provided by another embodiment of the present disclosure. As illustrated in FIG. 4B, compared with the array substrate illustrated in FIG. 3, in the array substrate illustrated in FIG. 4B, the reflection region layered structure 1110 does not include a base portion 110, but includes only the particle layer 112.

Figure 5:
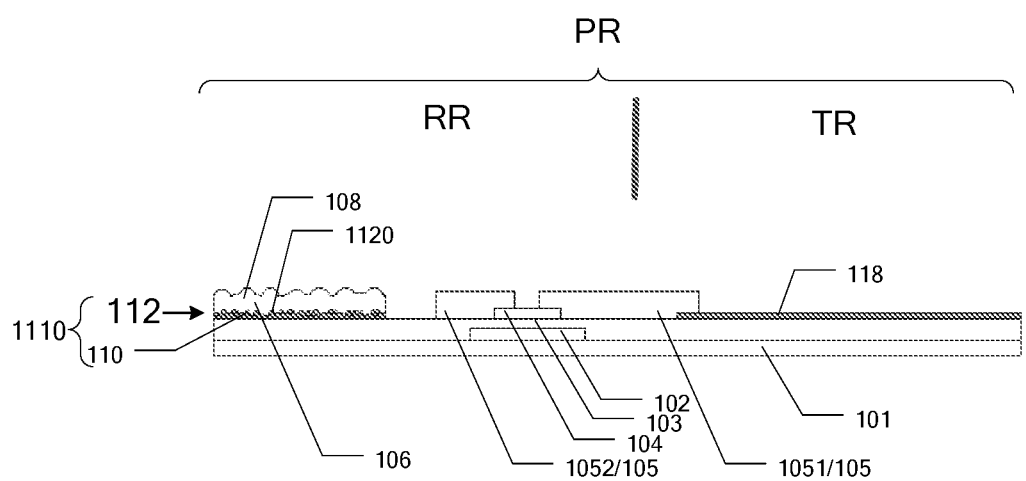
FIG. 5 is a schematic cross-sectional view of an array substrate provided by another embodiment of the present disclosure.

FIG. 5 is a schematic cross-sectional view of an array substrate provided by another embodiment of the present disclosure. As illustrated in FIG. 5, according to the array substrate provided by one or more embodiments of the present disclosure, the reflection region layered structure 1110 and the transmission electrode 118 can be in the same plane. For example, as illustrated in FIG. 5, the reflection electrode 108 and the source-drain electrode layer 105 are in the same layer. For example, the reflection region film 111 and the transmission electrode 118 are formed of the same film by the same patterning process. For example, the array substrate provided by the present embodiment can be used in a liquid crystal display device of a high aperture advanced super dimensional switching (HADS) mode.

FIG. 6 is a schematic cross-sectional view of an array substrate provided by another embodiment of the present disclosure. As illustrated in FIG. 6, according to the array substrate provided by one or more embodiments of the present disclosure, the reflection region layered structure 1110 and the semiconductor active layer 104 can be in the same layer. For example, the reflection region film 111 and the semiconductor active layer 104 are formed of the same film by the same patterning process. For example, the reflection electrode 108 and the source-drain electrode layer 105 are formed of the same film by the same patterning process. In FIG. 6, the transmission electrode 118 and the drain electrode 1051 are in direct contact with each other. For example, in FIG. 6, a passivation layer may be disposed between the transmission electrode 118 and the source-drain electrode layer 105, and the transmission electrode 118 is electrically connected to the drain electrode 1051 through a through-hole penetrating the passivation layer. For example, the array substrate provided by the present embodiment can be used in a liquid crystal display device with an oxide semiconductor as the active layer.

FIG. 7 is a flowchart of a manufacturing method of an array substrate provided by an embodiment of the present disclosure. As illustrated in FIG. 7, at least one embodiment of the present disclosure further provides a manufacturing method of an array substrate, which includes:

forming a reflection region film 111 on a base substrate 101, the base substrate 101 including a pixel region PR, the pixel region PR including a reflection region RR, the reflection region film 111 being formed in the reflection region RR;

roughening a surface of the reflection region film 111 facing away from the base substrate 101 to form a particle layer 112; and forming a reflection electrode 108 on the particle layer 112.

According to the manufacturing method provided by one or more embodiments of the present disclosure, a material of the reflection region film 111 includes a conductive material or a semiconductor material. For example, the material of the reflection region film 111 includes a metal oxide, and a material of the particle layer 112 includes a metal. For example, the metal oxide includes at least one selected from the group consisting of indium tin oxide (ITO) and indium gallium zinc oxide (IGZO).

According to the manufacturing method provided by one or more embodiments of the present disclosure, roughening the surface of the reflection region film 111 facing away from the base substrate 101 to form the particle layer 112 includes: performing a reduction treatment on the reflection region film 111 to allow at least the metal oxide contained in the surface of the reflection region film 111 to be reduced into metal particles, the particle layer 112 being configured to provide a granular rough surface on a side of the reflection region film 111 facing away from the base substrate 101.

According to the manufacturing method provided by one or more embodiments of the present disclosure, the reflection region film 111 is subjected to the reduction treatment to allow an entirety of the metal oxide contained in the reflection region film 111 to be reduced into metal particles, so that the reflection region film 111 is no longer presented in the array substrate. Therefore, the array substrate as illustrated in FIG. 4B can be formed.

According to the manufacturing method provided by one or more embodiments of the present disclosure, the reduction treatment is performed on the reflection region film 111 with a plasma. For example, the plasma is a reductive plasma, and the reductive plasma includes at least one selected from the group consisting of a hydrogen plasma and an ammonia plasma.

According to the manufacturing method provided by one or more embodiments of the present disclosure, a size of a particle in the particle layer 112 is less than or equal to 100 nm. A specific situation of the particle layer 112 in the method can refer to related descriptions of the particle layer in the array substrate.

FIG. 8A-8E are flowcharts of a manufacturing method of an array substrate provided by an embodiment of the present disclosure. The manufacturing method provided by one or more embodiments of the present disclosure is illustrated in FIG. 8A-8E.

Figure 8A:
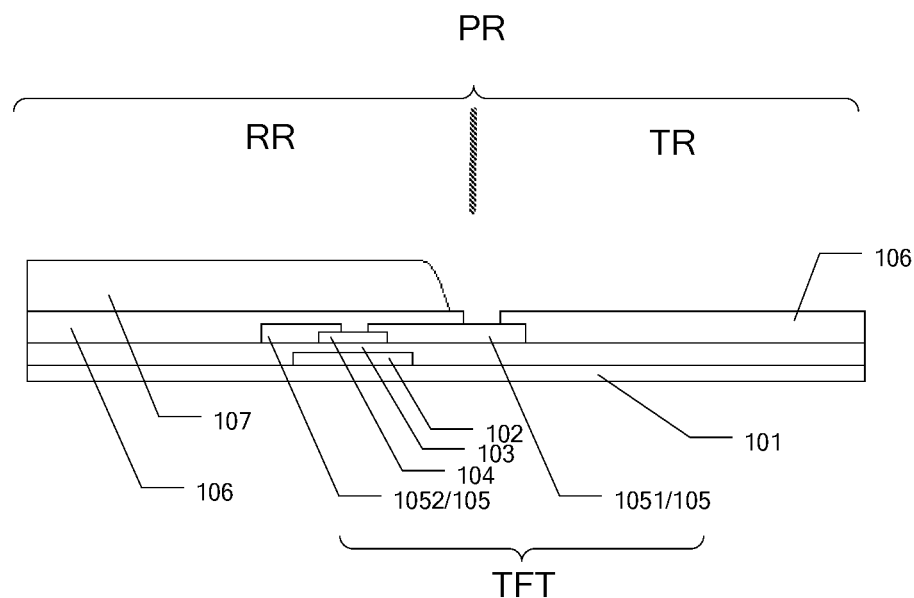
FIG. 8A-8E are flowcharts of a manufacturing method of an array substrate provided by an embodiment of the present disclosure.

FIG. 8A illustrates forming a TFT on a base substrate 101, and the TFT can be referred to aforementioned descriptions. The method further includes forming a passivation layer 106 on the TFT and forming a resin layer 107 in a reflection region RR, a surface of the resin layer 107 facing away from the base substrate 101 is a planar surface.

Figure 8B:
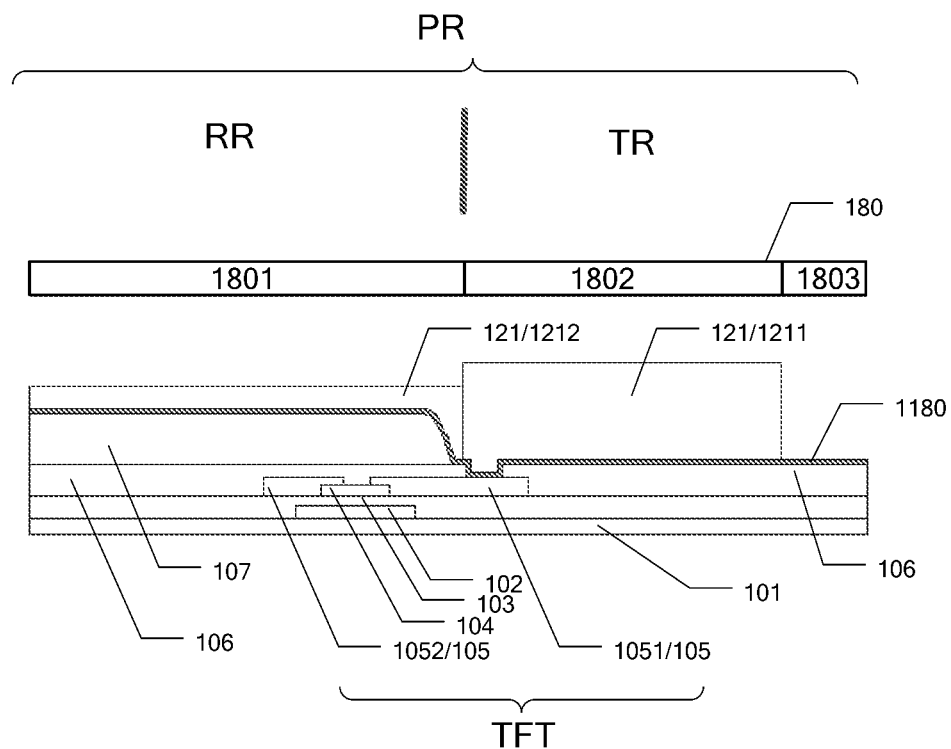

As illustrated in FIG. 8B, the method further includes forming a transparent conductive film (for example, ITO) 1180 made of a metal oxide on the passivation layer 106 and the resin layer 107, forming a photoresist film on the transparent conductive film 1180, and obtaining a photoresist layer 121 by exposing the photoresist film with a half tone mask 180 and then performing a development process. The half tone mask 180 includes a partially transparent region 1801, a completely opaque region 1802, and a completely transparent region 1803. A region of the half tone mask corresponding to the formation of the reflection electrode is the partially transparent region 1801. A region of the half tone mask corresponding to the formation of the transmission electrode 118 is the completely opaque region 1802. A remaining region of the half tone mask is the completely transparent region 1803, and a region corresponding thereto has no photoresist left after the development process. The photoresist layer 121 includes a first thickness photoresist 1211 and a second thickness photoresist 1212. A thickness of the first thickness photoresist 1211 is greater than a thickness of the second thickness photoresist 1212.

Figure 8C:
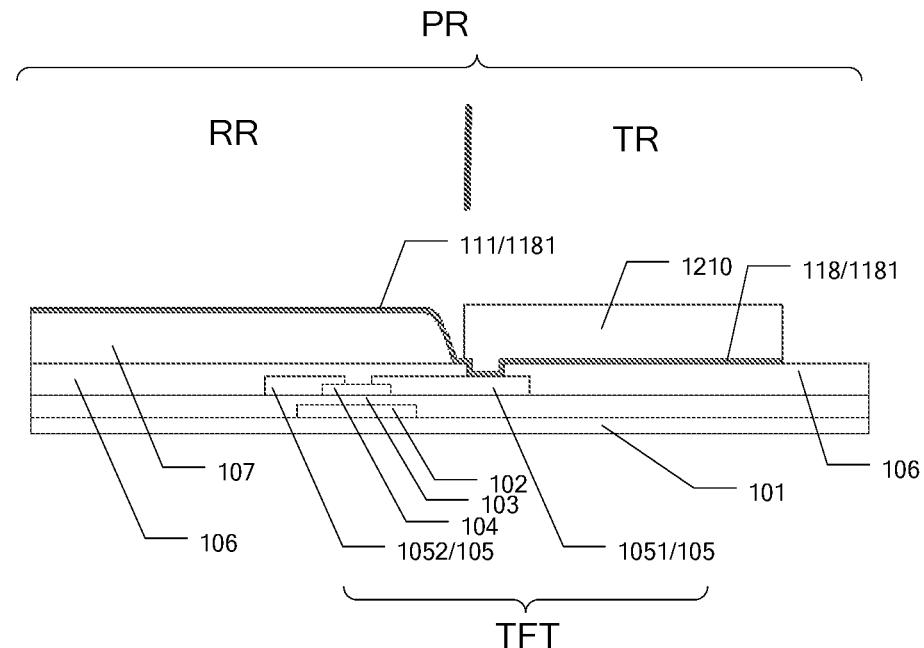

As illustrated in FIG. 8C, the method further includes etching the transparent conductive film 1180 (for example, wet etching may be adopted) by using the photoresist layer 121 as a mask to obtain a patterned transparent conductive film 1181, and ashing the photoresist layer 121 to remove the first thickness photoresist 1211 in order to obtain remaining photoresist 1210, and only the region corresponding to the formation of the transmission electrode 118 has the remaining photoresist. The patterned transparent conductive film 1181 includes a reflection region film 111 and the transmission electrode 118, and the remaining photoresist 1210 covers the transmission electrode 118.

Figure 8D:
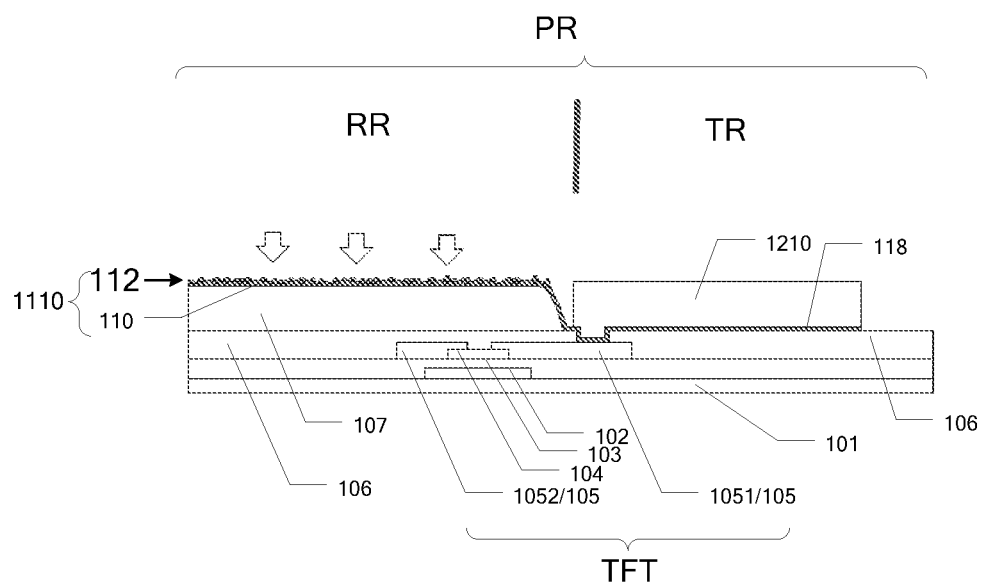

As illustrated in FIG. 8D, the method further includes performing a reduction treatment on the reflection region film 111 by using a plasma with the remaining photoresist 1210 as a mask, so that at least the metal oxide contained in the surface of the reflection region film 111 facing away from the base substrate is reduced into metal particles, thus forming a particle layer 112. The unreduced reflection region film 111 is the base portion 110, therefore, the particle layer 112 and the base portion 110 together constitute the reflection region layered structure 1110 (also as illustrated in FIG. 3).

As illustrated in FIG. 8D, the method further includes stripping off the remaining photoresist 1210.

For example, the metal oxide can be reduced by treatment by using a plasma of hydrogen ($H_2$) or ammonia ($NH_3$), and a surface morphology thereof becomes rough and is granular.

Figure 8E:
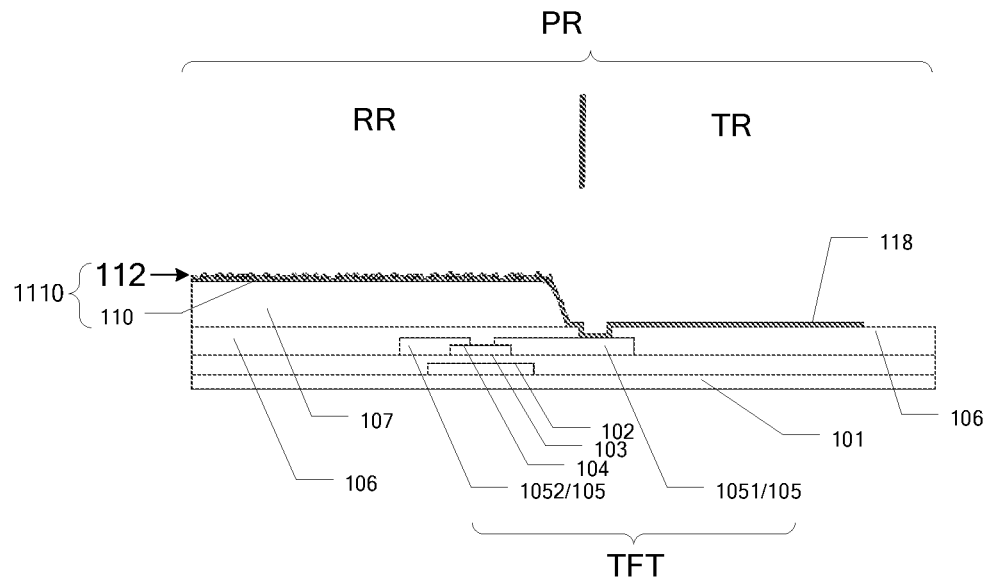
Figure 9A:
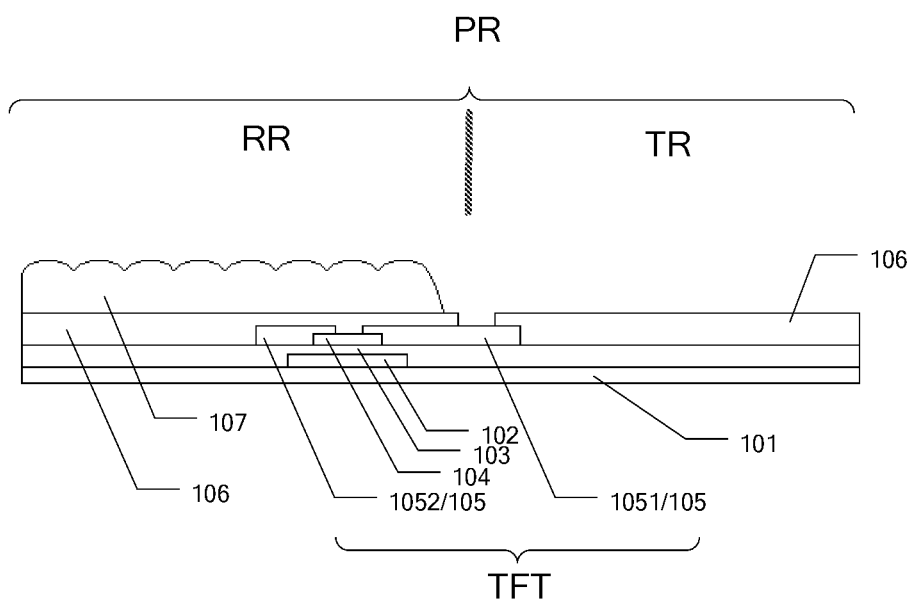
FIG. 9A-9E are flowcharts of a manufacturing method of an array substrate provided by another embodiment of the present disclosure.
Figure 9B:
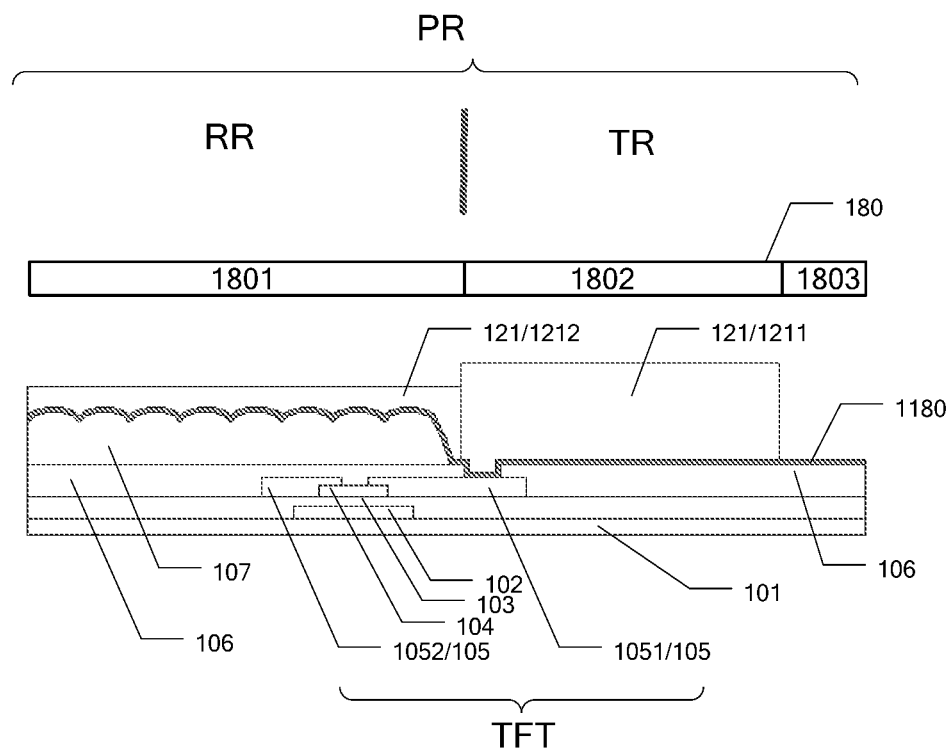
Figure 9C:
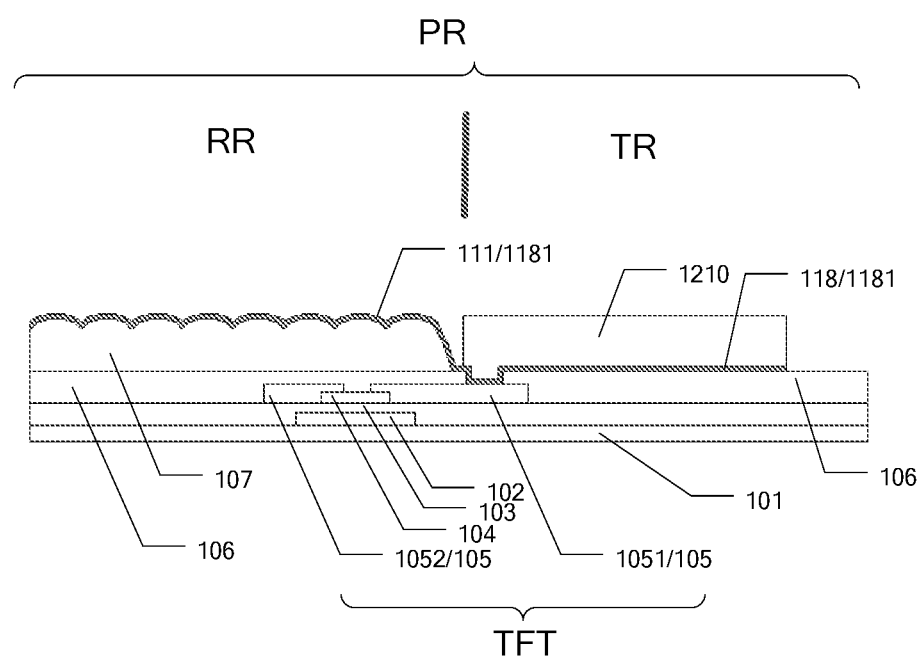
Figure 9D:
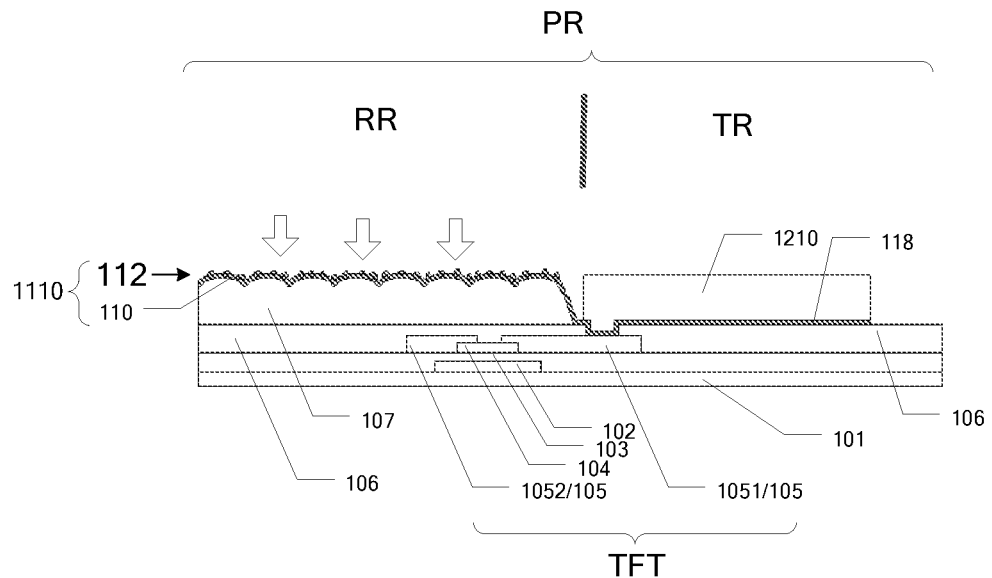
Figure 9E:
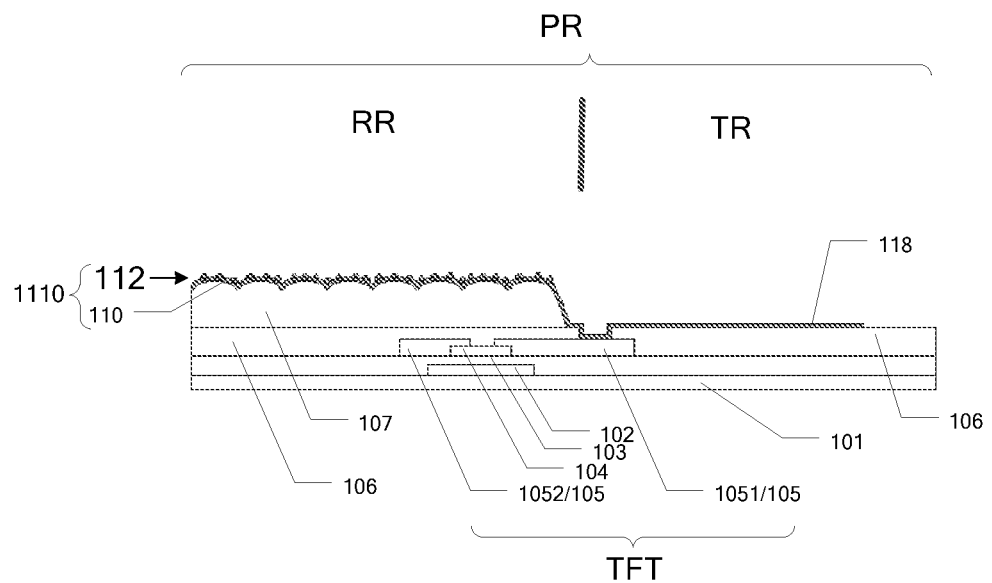

Based on FIG. 8E, after a reflection electrode 108 is formed on the particle layer 112 in the reflection region RR, the array substrate as illustrated in FIG. 3 can be obtained.

As illustrated in FIG. 8D-8E, according to the manufacturing method provided by one or more embodiments of the present disclosure, the pixel region PR further includes a transmission region TR, the transmission region TR includes the transmission electrode 118, and the reflection region film 111 and the transmission electrode 118 are in the same layer.

As illustrated in FIG. 8A-8E, according to the manufacturing method provided by one or more embodiments of the present disclosure, the manufacturing method further includes forming a TFT which includes a semiconductor active layer 104 and a source-drain electrode layer 105.

FIG. 9A-9E are flowcharts of a manufacturing method of an array substrate provided by another embodiment of the present disclosure. According to the manufacturing method provided by one or more embodiments of the present disclosure, as illustrated in FIG. 9A-9E, the present embodiment differs from the embodiment illustrated in FIG. 8A-8E in that a surface of the resin layer 107 facing away from the base substrate 101 is a concave-convex surface. For example, the concave-convex surface of the resin layer 107 can be obtained by exposure of a negative photoresist. Details can be referred to the description of the embodiment illustrated in FIG. 8A-8E, which are not repeatedly described herein. For the present embodiment, based on FIG. 9E, after the reflection electrode 108 is formed on the particle layer 112 in the reflection region RR, the array substrate as illustrated in FIG. 4 can be obtained.

Figure 10A:
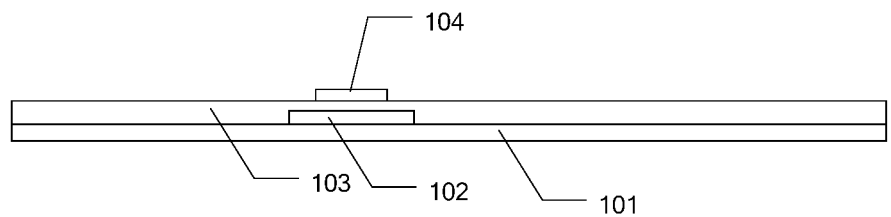
FIG. 10A-10C are flowcharts of a manufacturing method of an array substrate provided by another embodiment of the present disclosure.
Figure 10B:
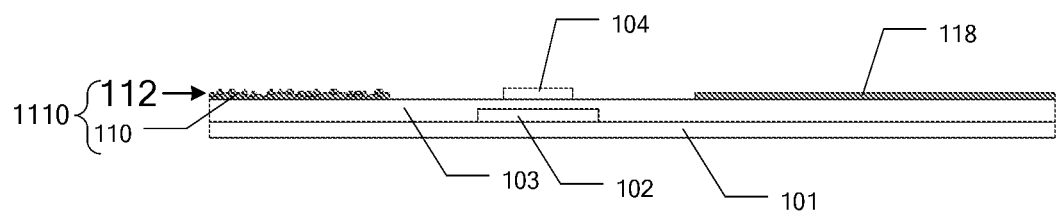
Figure 10C:
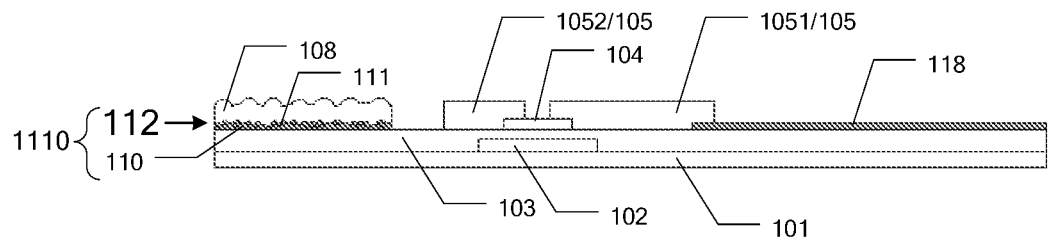

FIG. 10A-10C are flowcharts of a manufacturing method of an array substrate provided by another embodiment of the present disclosure. According to the manufacturing method provided by one or more embodiments of the present disclosure, as illustrated in FIG. 10A-10C, the resin layer 107 may be not provided. As illustrated in FIG. 10B, the reflection region film 111 and the transmission electrode 118 are in the same plane, and can be formed of the same film by the same patterning process. As illustrated in FIG. 10C, the reflection electrode 108 and the source-drain electrode layer 105 are in the same layer, and can be formed of the same film by the same patterning process.

Figure 11A:
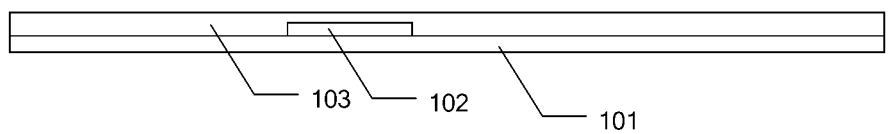
FIG. 11A-11C are flowcharts of a manufacturing method of an array substrate provided by another embodiment of the present disclosure.
Figure 11B:
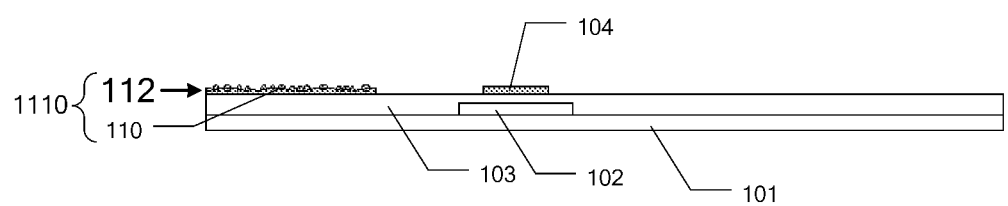
Figure 11C:
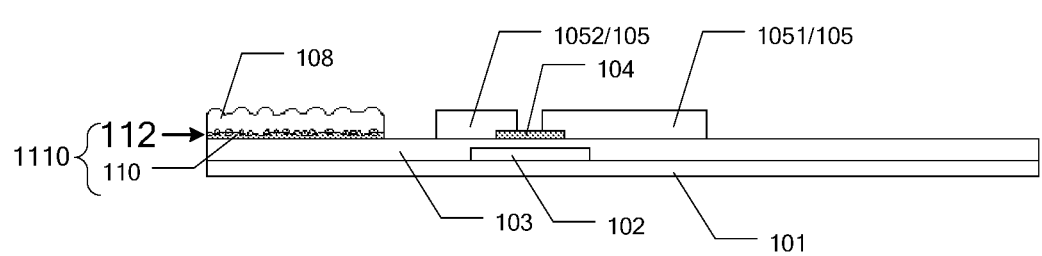

FIG. 11A-11C are flowcharts of a manufacturing method of an array substrate provided by another embodiment of the present disclosure. According to the manufacturing method provided by one or more embodiments of the present disclosure, as illustrated in FIG. 11A-11C, the reflection region film 111 and the semiconductor active layer 104 can be in the same layer, and the reflection region film 111 and the semiconductor active layer 104 are formed of the same film by the same patterning process. For example, the reflection electrode 108 and the source-drain electrode layer 105 are in the same layer, and are formed of the same film by the same patterning process. For example, in the present embodiment, a surface of the semiconductor active layer 104 in the TFT region is planar.

At least one embodiment of the present disclosure further provides a display device, which includes the array substrate provided by any one of the embodiments of the present disclosure.

For example, the display device includes a liquid crystal display device, without limited thereto.

Figure 12:
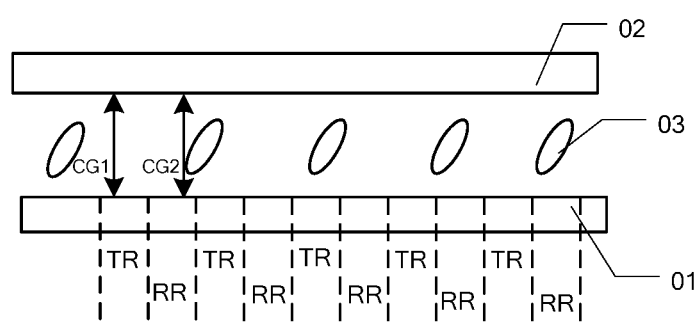
FIG. 12 is a schematic diagram of a display device provided by an embodiment of the present disclosure.

FIG. 12 is a schematic diagram of a display device provided by an embodiment of the present disclosure. For example, as illustrated in FIG. 12, the liquid crystal display device includes a base substrate 01 and an opposing substrate 02, as well as liquid crystal 03 sealed therebetween. For example, a cell gap CG1 in the transmission region TR is the same as a cell gap CG2 in the reflection region RR.

It should be noted that, for the purpose of clarity, in accompanying drawings for illustrating the embodiment(s) of the present disclosure, the thickness and size of a layer or a structure may be enlarged or narrowed. It should be understood that, in the case in which a component or element such as a layer, film, region, substrate or the like is referred to be "on" or "under" another component or element, it may be directly on or under the another component or element or a component or element is interposed therebetween.

In case of no conflict, features in one embodiment or in different embodiments can be combined.

The above are only specific implementations of the present disclosure, without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An array substrate, comprising:
   a base substrate comprising a pixel region, the pixel region comprising a reflection region;
   a reflection region layered structure in the reflection region, the reflection region layered structure comprising a particle layer, the particle layer being configured to provide a granular rough surface on a side of the reflection region layered structure facing away from the base substrate; and
   a reflection electrode on the particle layer,
   wherein the reflection region layered structure further comprises a base portion, and the particle layer is on a side of the base portion facing away from the base substrate and is in contact with the base portion, and wherein a material of the base portion comprises a conductive material or a semiconductor material.

2. The array substrate according to claim 1, wherein the material of the base portion comprises a metal oxide, and a material of the particle layer comprises a metal.

3. The array substrate according to claim 2, wherein the metal oxide comprises one selected from the group consisting of indium tin oxide (ITO) and indium gallium zinc oxide (IGZO).

4. The array substrate according to claim 2, wherein the pixel region further comprises a transmission region, the transmission region comprises a transmission electrode, and the reflection region layered structure and the transmission electrode are in a same layer.

5. The array substrate according to claim 2, further comprising a thin film transistor, wherein the thin film transistor comprises a semiconductor active layer and a source-drain electrode layer, the reflection region layered structure and the semiconductor active layer are in a same layer, the reflection electrode and the source-drain electrode layer are in a same layer.

6. The array substrate according to claim 2, further comprises a thin film transistor, wherein the thin film transistor comprises a semiconductor active layer and a source-drain electrode layer, and the source-drain electrode layer comprises a source electrode and a drain electrode, wherein the pixel region further comprises a transmission region, the transmission region comprises a transmission electrode, the transmission electrode is connected with the drain electrode, a material of the base portion and a material of the transmission electrode comprise a same metal oxide, and the base portion and the transmission electrode are of an integral structure.

7. The array substrate according to claim 2, further comprises a thin film transistor, wherein the thin film transistor comprises a gate electrode, a gate insulation layer, a semiconductor active layer and a source-drain electrode layer in sequence, the semiconductor active layer and the base portion are in contact with a same surface of the gate insulation layer, a material of the base portion and a material of the semiconductor active layer are a same semiconductor material, the source-drain electrode layer and the reflection electrode are on the semiconductor active layer and the reflection region layered structure, respectively, and a material of the source-drain electrode layer and a material of the reflection electrode are a same conductive material.

8. The array substrate according to claim 1, wherein a size of a particle in the particle layer is less than or equal to 100 nm.

9. A display device comprising the array substrate according to claim 1.

10. A manufacturing method of an array substrate, comprising:
forming a reflection region film on a base substrate, the base substrate comprising a pixel region, the pixel region comprising a reflection region, the reflection region film being formed in the reflection region;
roughening a surface of the reflection region film facing away from the base substrate to form a reflection region layered structure, the reflection region layered structure comprising a particle layer; and
forming a reflection electrode on the particle layer,
wherein the reflection region layered structure further comprises a base portion, and the particle layer is on a side of the base portion facing away from the base substrate and is in contact with the base portion, and
wherein a material of the base portion comprises a conductive material or a semiconductor material.

11. The manufacturing method according to claim 10, wherein roughening the surface of the reflection region film facing away from the base substrate comprises:
performing a reduction treatment on the reflection region film to allow metal oxide contained in the surface of the reflection region film to be reduced into metal particles, the particle layer being configured to provide a granular rough surface on a side of the reflection region film facing away from the base substrate.

12. The manufacturing method according to claim 11, wherein the reduction treatment is performed on the reflection region film with a plasma.

13. The manufacturing method according to claim 12, wherein the plasma is a reductive plasma, and the reductive plasma comprises at least one selected from the group consisting of a hydrogen plasma and an ammonia plasma.

14. The manufacturing method according to claim 10, wherein the pixel region further comprises a transmission region, the transmission region comprises a transmission electrode, and the reflection region film and the transmission electrode are formed of a same film by a same patterning process.

15. A manufacturing method of an array substrate, comprising:
forming a reflection region film on a base substrate, the base substrate comprising a pixel region, the pixel region comprising a reflection region, the reflection region film being formed in the reflection region;
roughening a surface of the reflection region film facing away from the base substrate to form a particle layer; and
forming a reflection electrode on the particle layer,
wherein the manufacturing method further comprises:
forming a thin film transistor, wherein the thin film transistor comprises a semiconductor active layer and a source-drain electrode layer, the reflection region film and the semiconductor active layer are formed of a same film by a same patterning process, the reflection electrode and the source-drain electrode layer are formed of a same film by a same patterning process.

* * * * *